(12) United States Patent
Yazawa

(10) Patent No.: US 10,262,936 B2
(45) Date of Patent: Apr. 16, 2019

(54) SEMICONDUCTOR DEVICE AND MANUFACTURING METHOD THEREOF

(71) Applicant: TOSHIBA MEMORY CORPORATION, Minato-ku (JP)

(72) Inventor: Hiroyuki Yazawa, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/459,255

(22) Filed: Mar. 15, 2017

(65) Prior Publication Data

US 2018/0226341 A1 Aug. 9, 2018

Related U.S. Application Data

(60) Provisional application No. 62/456,146, filed on Feb. 8, 2017.

(51) Int. Cl.
| | |
|---|---|
| *H01L 23/522* | (2006.01) |
| *H01L 23/528* | (2006.01) |
| *H01L 23/532* | (2006.01) |
| *H01L 27/115* | (2017.01) |
| *H01L 21/768* | (2006.01) |
| *H01L 27/11519* | (2017.01) |
| *H01L 27/11548* | (2017.01) |
| *H01L 27/11556* | (2017.01) |
| *H01L 27/11565* | (2017.01) |
| *H01L 27/11575* | (2017.01) |
| *H01L 27/11582* | (2017.01) |

(52) U.S. Cl.
CPC .... *H01L 23/5226* (2013.01); *H01L 21/76805* (2013.01); *H01L 21/76816* (2013.01); *H01L 21/76879* (2013.01); *H01L 23/5283* (2013.01); *H01L 23/53257* (2013.01); *H01L 27/115* (2013.01); *H01L 27/11519* (2013.01); *H01L 27/11548* (2013.01); *H01L 27/11556* (2013.01); *H01L 27/11565* (2013.01); *H01L 27/11575* (2013.01); *H01L 27/11582* (2013.01)

(58) Field of Classification Search
CPC ........... H01L 23/5226; H01L 21/76805; H01L 21/76816
USPC ........................................................ 257/774
See application file for complete search history.

(56) References Cited

U.S. PATENT DOCUMENTS

| | | | |
|---|---|---|---|
| 8,237,211 B2 | 8/2012 | Fukuzumi et al. | |
| 8,492,824 B2 | 7/2013 | Yahashi | |
| 8,896,051 B2 * | 11/2014 | Nansei | H01L 27/1157 257/324 |

(Continued)

FOREIGN PATENT DOCUMENTS

| | | |
|---|---|---|
| JP | 2010-98235 | 4/2010 |
| JP | 2011-60958 | 3/2011 |
| JP | 2012-174892 | 9/2012 |

*Primary Examiner* — Caleb E Henry
(74) *Attorney, Agent, or Firm* — Oblon, McClelland, Maier & Neustadt, L.L.P.

(57) ABSTRACT

A semiconductor device according to the present embodiment includes a stacked body having an end which is step-shaped and a contact in each of the steps of the end. Each of the steps includes alternating a plurality of conductive layers and a plurality of insulating layers. The contact includes a plurality of conductive films contacting each of the conductive layers, and a plurality of insulating films contacting each of the insulating layers, the insulating films being provided between the conductive films.

8 Claims, 10 Drawing Sheets

(56) References Cited

U.S. PATENT DOCUMENTS

| | | | |
|---|---|---|---|
| 9,230,987 B2* | 1/2016 | Pachamuthu | H01L 27/11582 |
| 9,768,186 B2* | 9/2017 | Shimabukuro | H01L 23/5226 |
| 2015/0243671 A1* | 8/2015 | Simsek-Ege | H01L 29/66825 |
| | | | 257/321 |
| 2016/0181143 A1* | 6/2016 | Kwon | H01L 27/1052 |
| | | | 438/586 |
| 2016/0307773 A1* | 10/2016 | Lee | H01L 21/31116 |

* cited by examiner

SEMICONDUCTOR DEVICE AND MANUFACTURING METHOD THEREOF

CROSS-REFERENCE TO RELATED APPLICATIONS

This application is based upon and claims the benefit of priority from U.S. Provisional Application No. 62/456,146 filed on Feb., 8, 2017; the entire contents of which are incorporated herein by reference.

FIELD

The present invention relates to a semiconductor device and a manufacturing method thereof.

BACKGROUND

A three-dimensional memory has been known as an example of a semiconductor device. The three-dimensional memory includes a stacked body having a plurality of conductive layers alternating with a plurality of insulating layers. An end of the stacked body is formed in a step-shaped, and a contact hole is formed in each of the steps. A contact is in the contact hole, and the contact contacts each of the conductive layers.

Conventionally, one contact hole has been formed for one conductive layer. Thus, if the number of conductive layers increases, the depth of a contact hole corresponding to the conductive layer on the lower layer side increases. As a result, an aspect ratio (depth/hole diameter) increases so that a manufacturing failure of the contact easily occurs.

DETAILED DESCRIPTION

Embodiments will now be explained with reference to the accompanying drawings. The present invention is not limited to the embodiments.

A semiconductor device according to the present embodiment includes a stacked body having an end which is step-shaped and a contact in each of the steps of the end. Each of the steps includes alternating a plurality of conductive layers and a plurality of insulating layers. The contact includes a plurality of conductive films contacting each of the conductive layers, and a plurality of insulating films contacting each of the insulating layers, the insulating films being provided between the conductive films.

(First Embodiment)

Figure 1A:
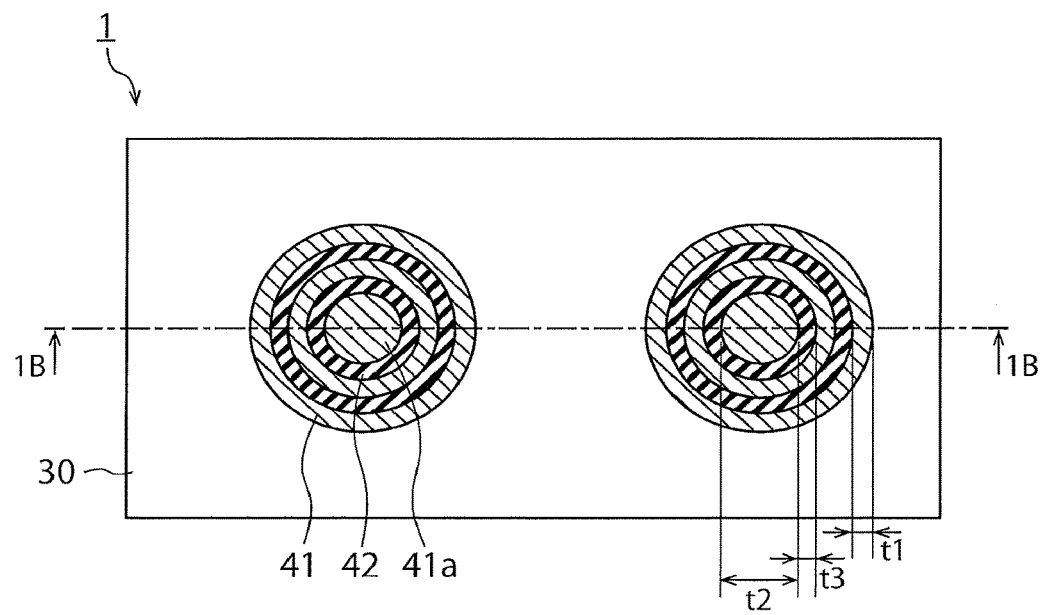
FIGS. 1A and 1B are diagrams each showing a schematic structure of a semiconductor device according to a first embodiment.
Figure 1B:
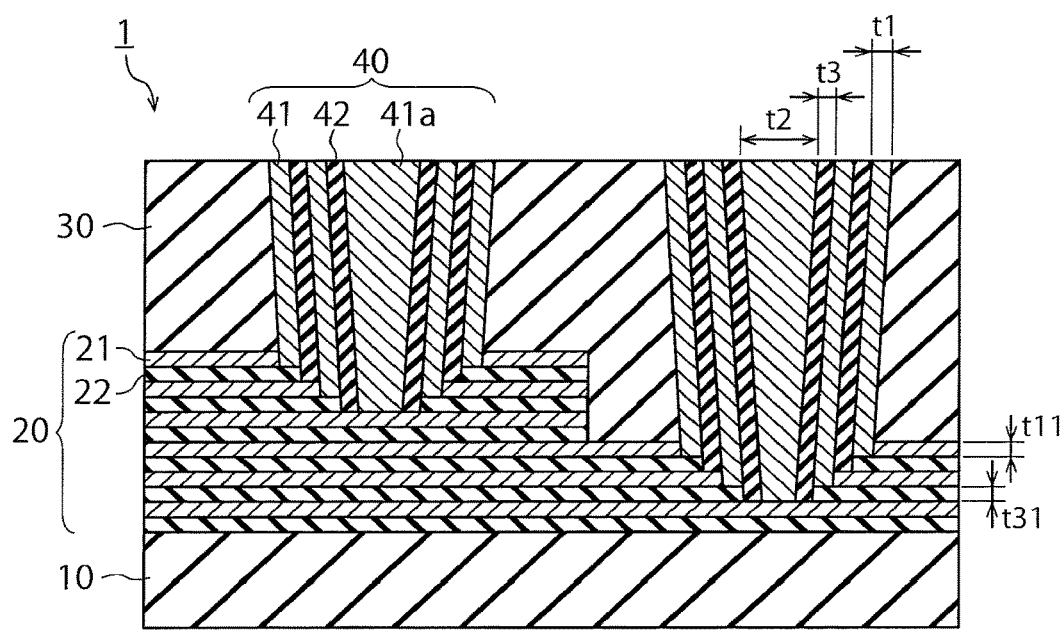

FIG. 1A is a plan view showing a contact in a semiconductor device 1 according to a first embodiment, and FIG. 1B is a cross sectional view along a section line 1B-1B shown in FIG. 1. The semiconductor device 1 includes a substrate 10, a stacked body 20, an interlayer insulating film 30, and a contact 40.

The substrate 10 includes a silicon substrate, for example. The stacked body 20 is on the substrate 10. As shown in FIG. 1B, an end of the stacked body 20 has a step-shaped. Each of the steps of the end includes a plurality of conductive layers 21 alternating with a plurality of insulating layers 22. Each of the conductive layers 21 is electrically connected to a memory cell (not shown). Each of the conductive layers 21 includes tungsten (W), for example, and each of the insulating layers 22 includes silicon oxide ($SiO_2$), for example.

In the present embodiment, the number of steps of the end of the stacked body 20 is two. However, the number of steps of the end may be more than two. While each of the steps includes three conductive layers 21 alternating with three insulating layers 22, the respective numbers of conductive layers 21 and insulating layers 22 may be two or more.

The interlayer insulating film 30 is on the stacked body 20. The interlayer insulating film 30 includes silicon oxide, for example. The contact 40 is in the interlayer insulating film 30.

The contact 40 includes a plurality of conductive films 41 and a plurality of insulating films 42. The plurality of conductive films 41 contact the plurality of conductive layers 21, respectively. The thickness t1 of each of the conductive films 41 may be greater than the thickness t11 of each of the conductive layers 21 to reduce an electrical resistance, or may be thinner than the thickness t11 to adjust the electrical resistance. Each of the conductive films 41 includes tungsten, for example.

The plurality of insulating films 42 are between the plurality of conductive films 41, and respectively contact the plurality of insulating layers 22. The thickness t3 of each of the insulating films 42 may be the same as or different from the thickness t31 of each of the insulating layers 22. The thickness t3 of each of the insulating films 42 may be the same as or different from the thickness t1 of each of the conductive films 41. Each of the insulating films 42 includes silicon oxide, for example.

In the present embodiment, the plurality of conductive films 41 include a first conductive film 41a contacting the conductive layer 21 positioned in a lowermost layer in each of the steps. The first conductive film 41a is on the innermost side of the contact 40. A planar shape of the other conductive films 41 is a concentric shape centered around the first conductive film 41a, as shown in FIG. 1A.

If the planar shape of the other conductive films 41 is a concentric shape such as a concentric circle, the conductive film 41 positioned on the outermost side of the contact 40 contacts the conductive layer 21 positioned in an uppermost layer in each of the steps so that the length thereof in a vertical direction is the smallest. On the other hand, the first conductive film 41a contacts the conductive layer 21 in the lowermost layer so that the length thereof in the vertical direction is the largest. Therefore, when a difference in length between the conductive film 41 and the first conductive film 41a is large, a difference in electrical resistance also becomes the largest. To suppress the difference in the electrical resistance, the thickness t2 of the first conductive film 41a is preferably the largest.

The respective lengths of the other conductive films 41 increase as distances of the other conductive films 41 to the first conductive film 41a decrease. Therefore, the respective thickness t1 of the other conductive films 41 preferably increase as the distances of the other conductive films 41 to the first conductive film 41a decrease. Thus, a variation in the electrical resistance can be further suppressed in the whole of the conductive films 41 in each of the steps.

Figure 2:
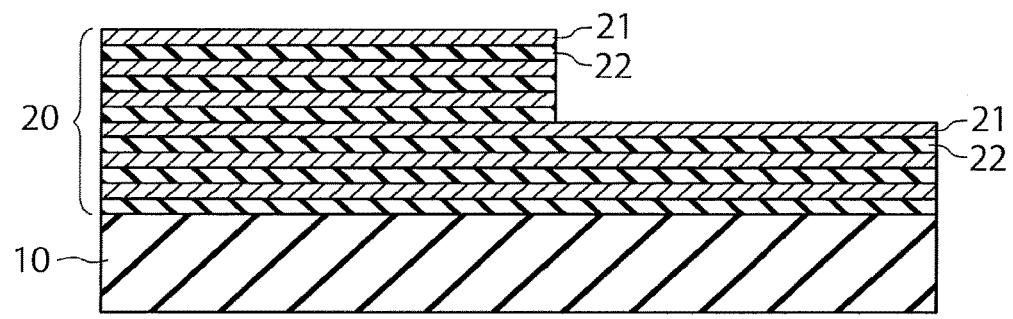
FIGS. 2 to 9 are cross sectional views each showing processes for manufacturing the semiconductor device according to the first embodiment.

A method for manufacturing the aforementioned semiconductor device 1 will be described below with reference to FIGS. 2 to 9. At first, a stacked body 20 is formed on a substrate 10, and an end of the stacked body 20 is formed in a step-shaped, as shown in FIG. 2. At this time, the end is formed in a step-shaped each including a plurality of conductive layers 21 and the plurality of insulating layers 22.

Figure 3:
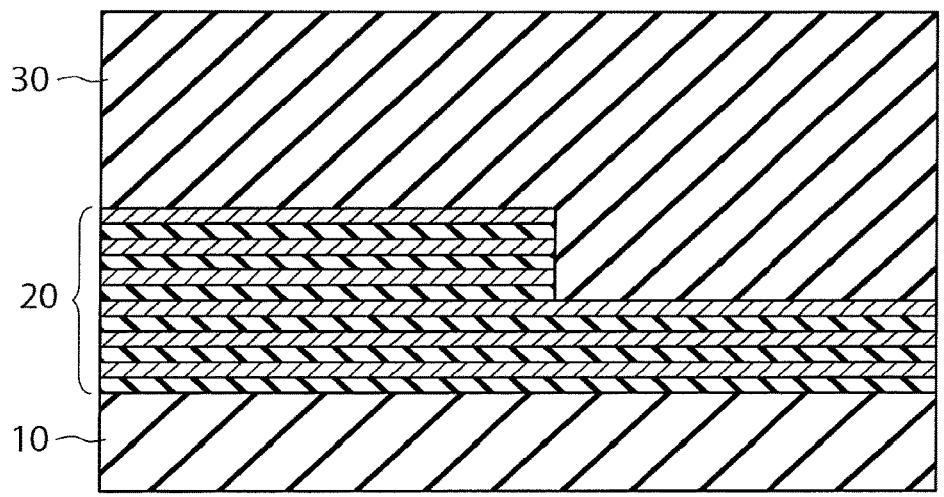
Figure 4:
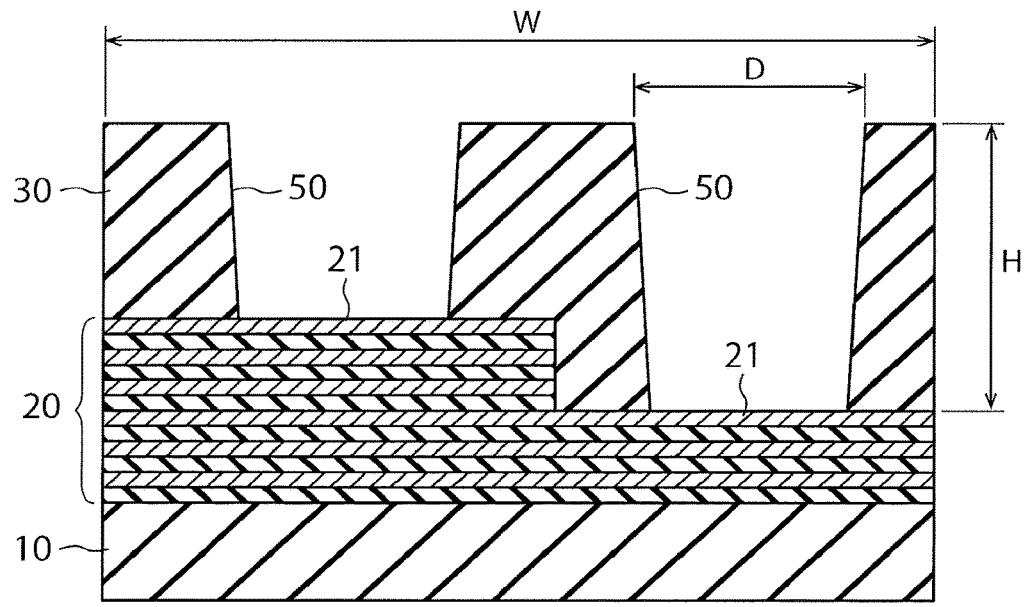

As shown in FIG. 3, the end of the stacked body 20 is then covered with an interlayer insulating film 30. Then, a contact hole 50 is formed in the interlayer insulating film 30, as shown in FIG. 4. The contact hole 50 is formed in each of the steps of the end of the stacked body 20. Therefore, a part of the conductive layer 21 in the uppermost layer in each of the steps is exposed from the contact hole 50.

Figure 5:
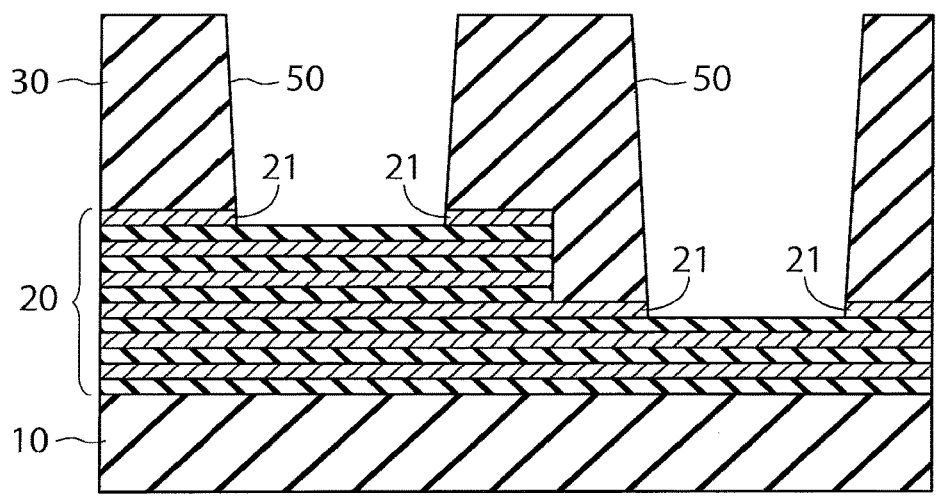
Figure 6:
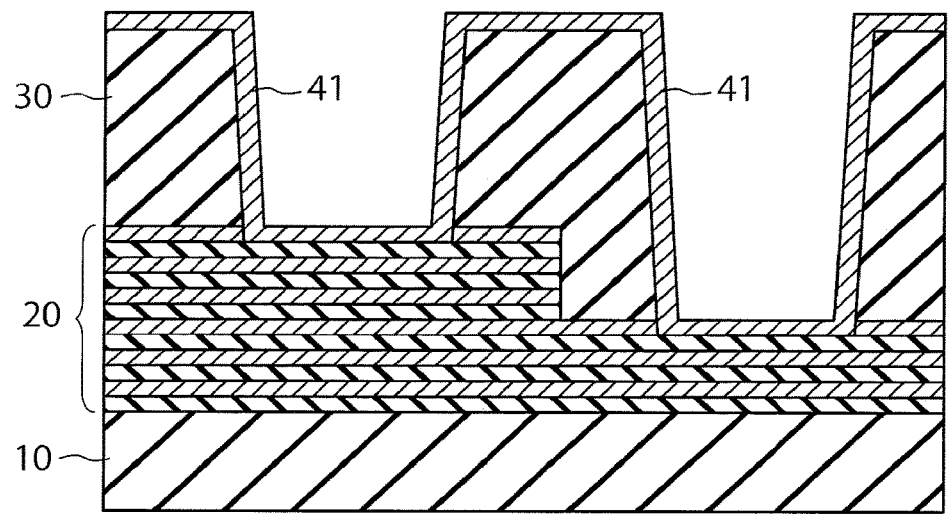

As shown in FIG. 5, the conductive layer 21 in the uppermost layer formed on the bottom of the contact hole 50 is then partially etched. Subsequently, as shown in FIG. 6, a conductive film 41 is formed in the contact hole 50.

Figure 7:
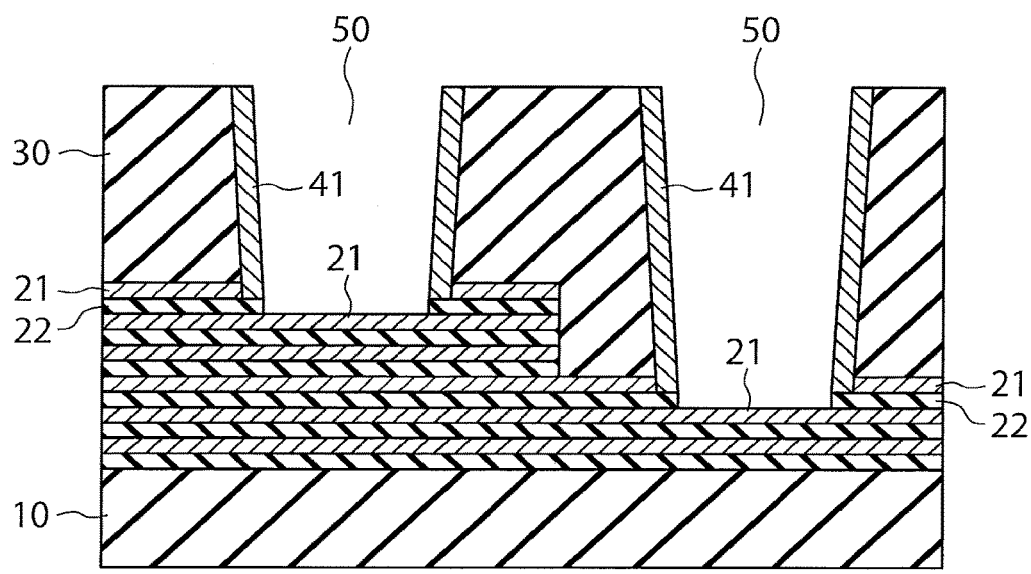

Subsequently, as shown in FIG. 7, the conductive film 41 formed on the bottom of the contact hole 50 and the insulating layer 22 contacting the conductive film 41 are partially etched. As a result, a part of the conductive layer 21, which is positioned one layer below the uppermost layer, is exposed from the contact hole 50. At this time, the conductive film 41 remains on side surfaces of the contact hole 50. Therefore, connection between the remaining conductive film 41 and the conductive layer 21 in the uppermost layer is maintained.

Figure 8:
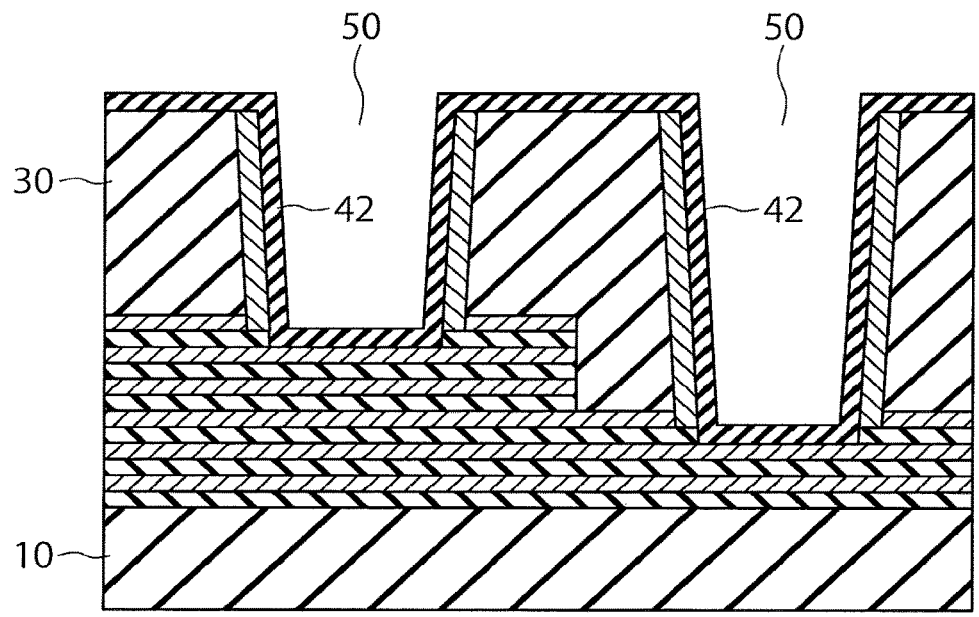

As shown in FIG. 8, an insulating film 42 is then formed in the contact hole 50. Thus, the conductive film 41 remaining on the side surfaces of the contact hole 50 and the conductive layer 21 exposed from the contact hole 50 are covered with the insulating film 42.

Figure 9:
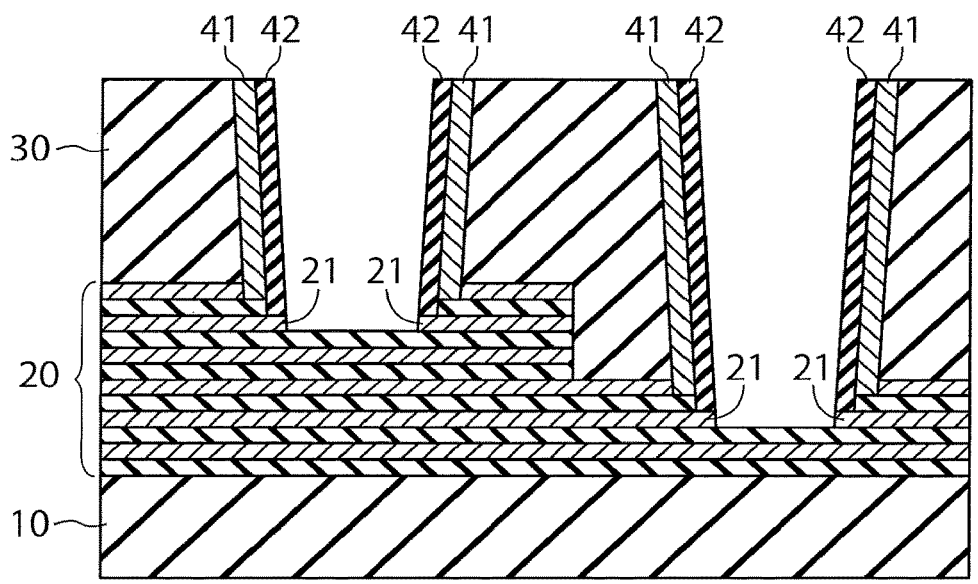

As shown in FIG. 9, the insulating film 42 formed on the bottom of the contact hole 50 and the conductive layer 21 contacting the insulating film 42 are then partially etched. As a result, a part of the insulating layer 22, which is positioned one layer below the uppermost layer, is exposed again from the contact hole 50. At this time, the insulating film 42 remains on the side surfaces of the contact hole 50. Therefore, electrical insulation between the conductive films 41 is ensured.

Then, the insulating layers 22 in each of the steps are partially etched one by one in descending order from the uppermost layer every time a conductive film 41 is formed, and the conductive layers 21 in each of the steps are partially etched one by one in descending order from the uppermost layer every time an insulating film 42 is formed. As a result, a contact 40 is completed.

According to the present embodiment described above, the plurality of conductive layers 21 and the plurality of insulating layers 22 are provided in each of the steps of the end of the stacked body 20. The plurality of conductive layers 21 are respectively connected to the plurality of conductive films 41, and the plurality of conductive films 41, together with the plurality of insulating films 42, are in the one contact hole 50. Thus, the hole diameter D of the contact hole 50 can be made greater than that in a conventional method in which one contact hole 50 is formed for one conductive layer 21. Therefore, an aspect ratio (depth H/hole diameter D) of the contact hole 50 decreases so that a manufacturing failure of the contact 40 can be reduced.

Moreover, the number of contact holes can be made smaller than that in the conventional method so that the step width W of the end decreases. Therefore, even if the number of stacks in the stacked body 20 increases, i.e., a memory capacity increases, the semiconductor device 1 can be inhibited from increasing in size.

Furthermore, in the present embodiment, the number of conductive layers 21 is same for all the steps, and the number of insulating layers 22 is also same for all the steps. Therefore, the respective contacts 40 in the steps can be collectively formed so that a manufacturing period of time of the contacts 40 can be shortened.

Figure 10:
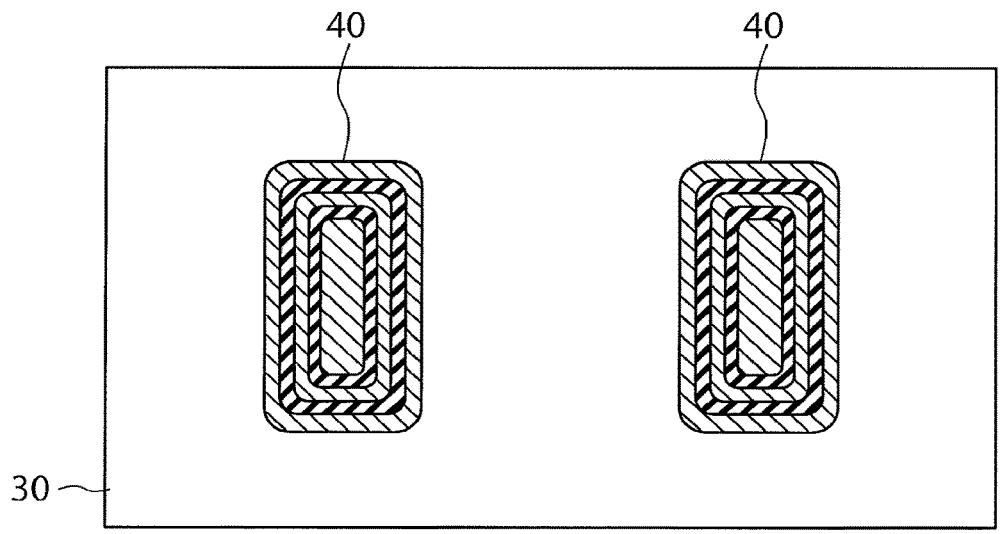
FIG. 10 is a plan view showing a modification of a contact according to the first embodiment.
Figure 11:
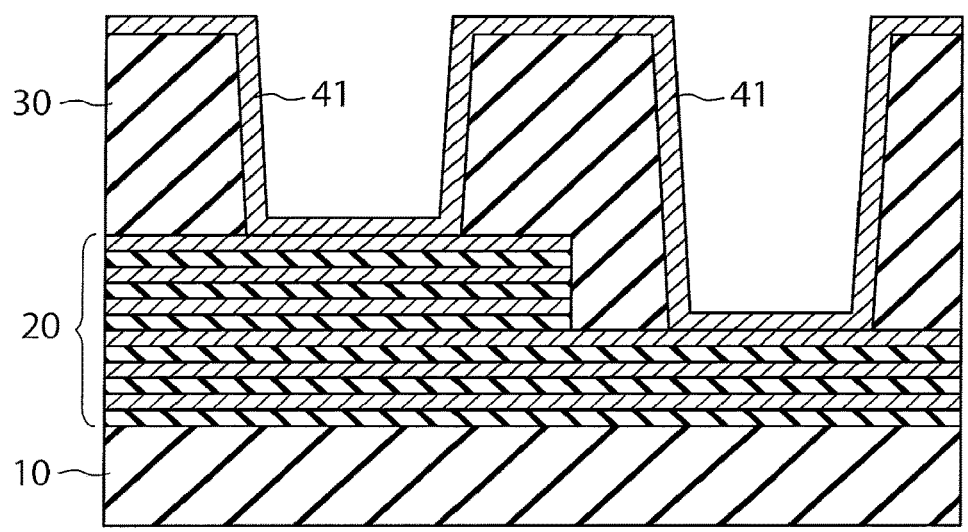
FIGS. 11 to 14 are cross sectional views each showing processes for manufacturing a contact according to a second embodiment.

A planar shape of the plurality of conductive films 41 is not limited to the concentric circle shown in FIG. 1A, but may be a concentric polygon represented by a concentric square shown in FIG. 10, for example. Here, the polygon can include a shape corners of which are rounded, as shown in FIG. 10. In this case, the aforementioned effect can also be obtained, like when the planar shape is the concentric circle.

(Second Embodiment)

In a second embodiment, a method for manufacturing a contact 40 differs from that in the first embodiment. Processes for manufacturing the contact 40 according to the present embodiment will be described below with reference to FIGS. 11 to 14.

The processes are similar to those in the first embodiment until the process for forming a contact hole 50 (see FIG. 4) in the processes for manufacturing the contact 40 according to the present embodiment. After the contact hole 50 is formed, a conductive film 41 is formed in the contact hole 50. The conductive film 41 contacts a conductive layer 21 in an uppermost layer. When the conductive film 41 is formed, a barrier metal (not shown) containing titanium tungsten (TiW), for example, is preferably formed between the conductive film 41 and an interlayer insulating film 30 to prevent the conductive film 41 from being diffused to the interlayer insulating film 30.

Figure 12:
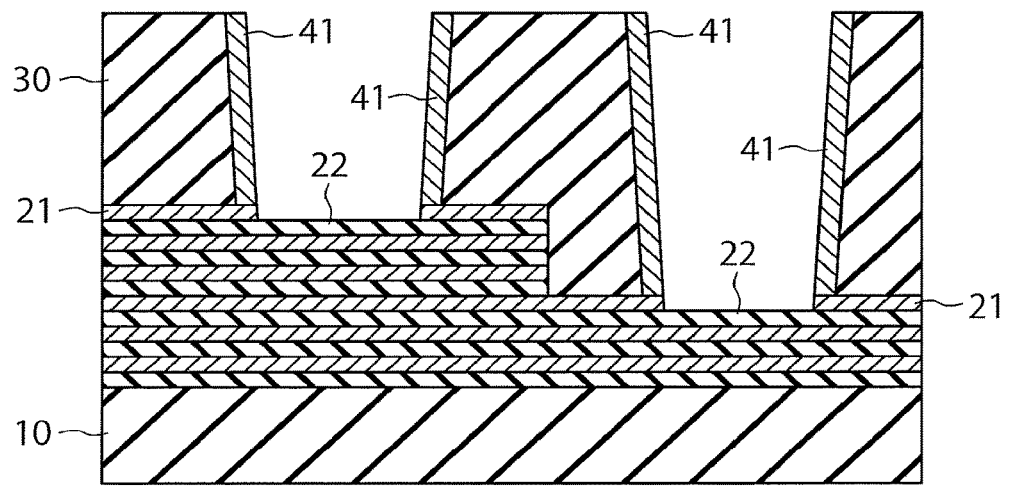

As shown in FIG. 12, the conductive film 41 formed on the bottom of the contact hole 50 and the conductive layer 21 contacting the conductive film 41 are then partially etched. As a result, a part of an insulating layer 22 positioned under the etched conductive layer 21 is exposed from the contact hole 50. At this time, the conductive film 41 remains on side surfaces of the contact hole 50. Therefore, connection between the remaining conductive film 41 and the conductive layer 21 in the uppermost layer is maintained.

Figure 13:
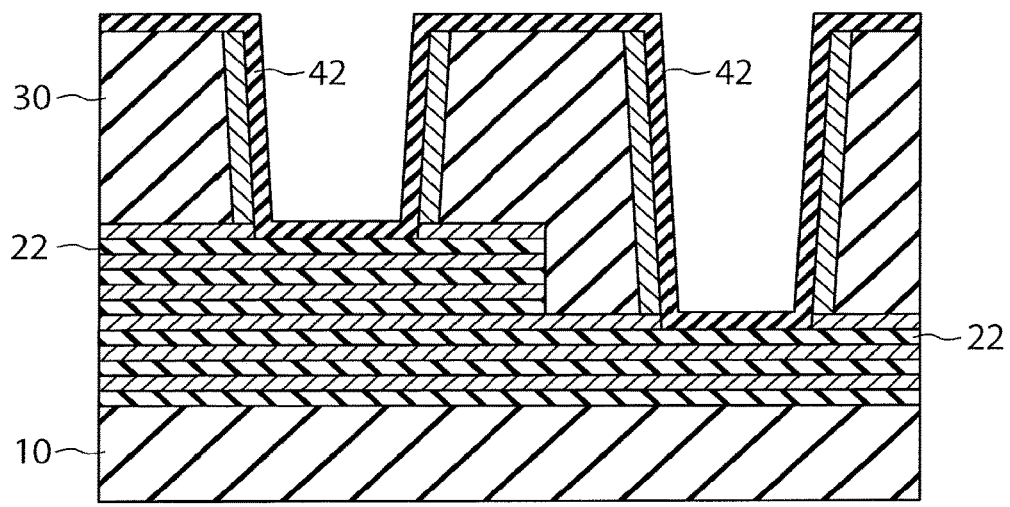

As shown in FIG. 13, an insulating film 42 is then formed in the contact hole 50. Thus, the conductive film 41 remaining on the side surfaces of the contact hole 50 and the insulating layer 22 exposed from the contact hole 50 are covered with the insulating film 42.

Figure 14:
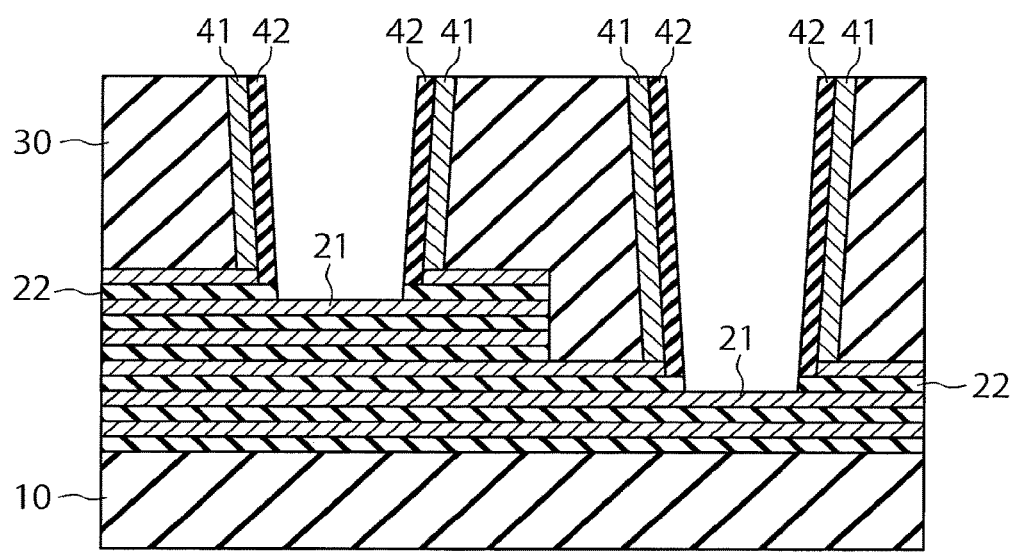

As shown in FIG. 14, the insulating film 42 formed on the bottom of the contact hole 50 and the insulating layer 22 contacting the insulating film 42 are then partially etched. As a result, a part of the conductive layer 21 positioned under the etched insulating layer 22 is exposed from the contact hole 50. At this time, the insulating film 42 remains on the side surfaces of the contact hole 50. Therefore, electrical insulation between the conductive films 41 is ensured.

Then, the conductive layers 21 in each of the steps are partially etched one by one in descending order from the uppermost layer every time a conductive film 41 is formed, and the insulating layers 22 in each of the steps are partially etched one by one in descending order from the uppermost layer every time an insulating film 42 is formed. As a result, the contact 40 is completed, like in the first embodiment.

In the present embodiment described above, the plurality of conductive films 41 respectively contacting the different conductive layers 21 are also formed in the one contact hole 50, like in the first embodiment. Therefore, the diameter D of the contact hole 50 can be increased. As a result, an aspect ratio of the contact hole 50 decreases so that a manufacturing failure of the contact 40 can be reduced.

Moreover, in the present embodiment, etching is performed in a combination of the conductive films 41 and the conductive layers 21, and etching is performed in combination of the insulating films 42 and the insulating layers 22. That is, in the present embodiment, an insulating member and a conductive member are separately etched. Thus, an optimum etching condition can be selected for each of the members.

(Third Embodiment)

Figure 15A:
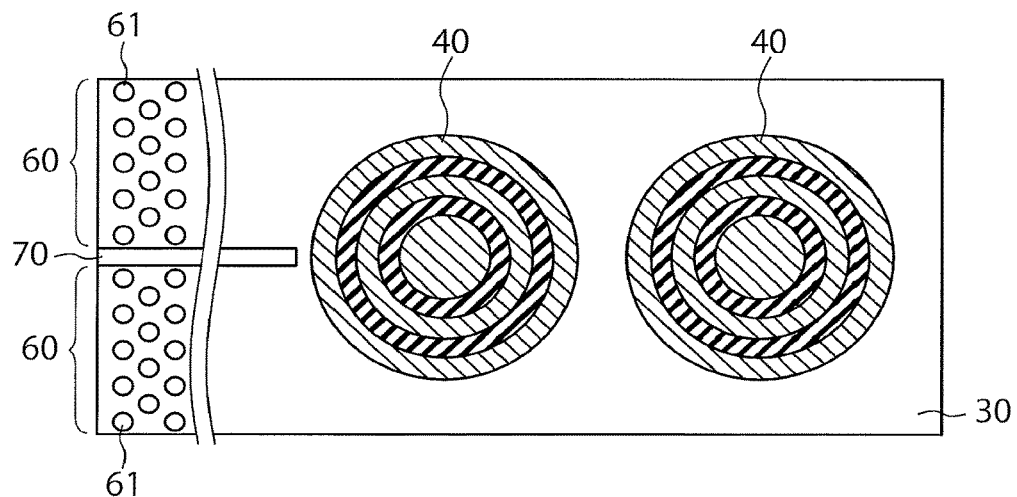
FIGS. 15A and 15B are plan views each showing processes for manufacturing a semiconductor device according to a third embodiment.

In a third embodiment, a contact 40 is formed over a plurality of memory hole regions 60, as shown in FIG. 15A. The plurality of memory hole regions 60 are separated by a slit 70, and a plurality of memory cells 61 are in each of the memory hole regions 60. Each of the memory cells 61 is electrically connected to a conductive film 41 in the contact 40 via a conductive layer 21 in a stacked body 20. The plurality of memory hole regions 60, the plurality of memory cells 61, and the slit 70 are also in the semiconductor devices respectively described in the first embodiment and the second embodiment.

Figure 15B:
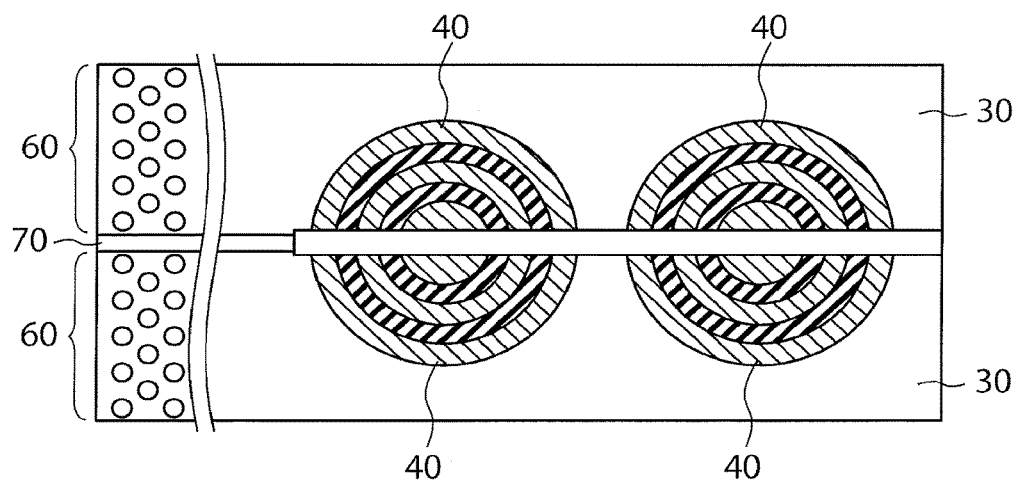

In the present embodiment, the contact 40 is etched along the slit 70. As a result, the contact 40 is divided corresponding to each of the memory hole regions 60, as shown in FIG. 15B. Each of contact parts 40 obtained by the division independently functions as a contact of the plurality of memory cells 61 provided in the corresponding memory hole region 60.

According to the present embodiment described above, a plurality of conductive films 41 respectively contacting different conductive layers 21 are formed in one contact hole 50. Therefore, the diameter D of the contact hole 50 can be increased. As a result, an aspect ratio of the contact hole 50 decreases so that a manufacturing failure of the contact 40 can be reduced.

Moreover, in the first embodiment and the second embodiment, the contact 40 is used in the one memory hole region 60. On the other hand, in the present embodiment, the contact 40 can be used in the plurality of memory hole regions 60. Therefore, the use efficiency of the contact 40 can be increased.

Figure 16:
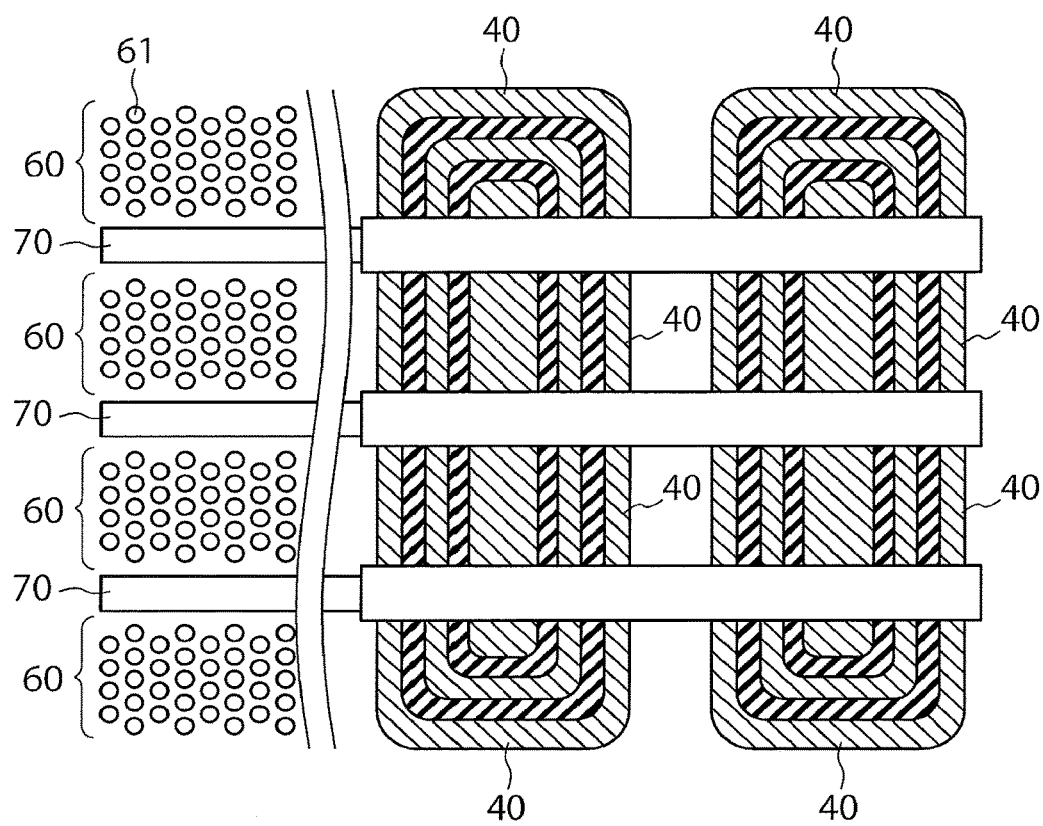
FIG. 16 is a plan view showing a modification of a contact according to the third embodiment.

While the contact 40 is divided into two parts in the present embodiment, the number of divisions is not particularly limited. If a planar shape of a conductive film 41 is a concentric square, for example, the contact 40 can be used in four memory hole regions 60 by being divided into four parts, as shown in FIG. 16. In this case, the use efficiency of the contact 40 can be further increased.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device, comprising:
a stacked body having an end which is step-shaped; and
a contact in each of the steps of the end, wherein
each of the steps includes alternating a plurality of conductive layers and a plurality of insulating layers,
the contact includes a plurality of conductive films directly contacting each of the conductive layers, and a plurality of insulating films directly contacting each of the insulating layers, the insulating films being provided between the conductive films,
the plurality of conductive films include a first conductive film contacting the conductive layer in a lowermost layer in each of the steps and positioned on the innermost side of the contact, and
a planar shape of the other conductive films excluding the first conductive film is a concentric shape centered around the first conductive film.

2. The semiconductor device according to claim 1, wherein a planar shape of the other conductive films is a concentric circle.

3. The semiconductor device according to claim 1, wherein a planar shape of the other conductive films is a polygon.

4. The semiconductor device according to claim 1, further comprising a plurality of memory hole regions each provided with a plurality of memory cells,
wherein the contact is divided corresponding to each of the memory hole regions.

5. The semiconductor device according to claim 4, wherein the number of divisions of the contact is more than two.

6. The semiconductor device according to claim 1, wherein the thickness of the first conductive film is the greatest among the plurality of conductive films.

7. The semiconductor device according to claim 6, wherein the respective thicknesses of the other conductive films excluding the first conductive film increase as distances to the first conductive film decrease.

8. The semiconductor device according to claim 1, wherein the number of the conductive layers is same for all the steps, and the number of the insulating layers is also same for all the steps.

* * * * *